United States Patent
Wakai et al.

[11] Patent Number: 5,926,065
[45] Date of Patent: Jul. 20, 1999

[54] DIGITAL MODULATOR HAVING A DIGITAL FILTER INCLUDING LOW-SPEED CIRCUIT COMPONENTS

[75] Inventors: Hirotake Wakai, Koganei; Makoto Ohnishi, Tokyo; Fumihito Tomaru, Higashikurume, all of Japan

[73] Assignee: Hitachi Denshi Kabushiki Kaisha, Tokyo, Japan

[21] Appl. No.: 08/947,348

[22] Filed: Oct. 8, 1997

[30] Foreign Application Priority Data

Oct. 11, 1996 [JP] Japan ..................... 8-270144

[51] Int. Cl.$^6$ .................... H03D 3/00; H04L 27/22; H04L 27/38
[52] U.S. Cl. .................... 329/304; 329/306; 375/261; 375/328; 375/329
[58] Field of Search .................... 329/304–310; 375/261, 324, 328–333

[56] References Cited

U.S. PATENT DOCUMENTS

5,172,070  12/1992  Hiraiwa et al. .................... 329/304

*Primary Examiner*—David Mis
*Attorney, Agent, or Firm*—Antonelli, Terry, Stout & Kraus, LLP

[57] ABSTRACT

A digital demodulator which demodulates an analog signal obtained through a quadrature amplitude modulation to produce a digital demodulated signal includes a converter to convert the analog signal into a digital signal and a signal processor to quadrature-demodulating the digital signal from the converter. Assuming that the analog signal has a carrier frequency of $f_{IF}$ and the signal conversion is accomplished with the sampling frequency fs, the demodulator is set to satisfy $fs=4 \cdot f_{IF}/(2n+1)$, where n denotes a positive integer. The signal processing section conducts the quadrature demodulation according to a quadrature local oscillation signal having a frequency fc satisfying fc=fs/4.

3 Claims, 8 Drawing Sheets

FIG.8

DIGITAL MODULATOR HAVING A DIGITAL FILTER INCLUDING LOW-SPEED CIRCUIT COMPONENTS

BACKGROUND OF THE INVENTION

The present invention relates to a demodulator circuit of quadrature amplitude modulation (QAM) signals, and in particular, to a digital demodulator for producing a digital demodulation signal through digital signal processing by an analog-to-digital converter.

Heretofore, the quadrature amplitude modulation method has been broadly employed in various fields because of its capability of highly efficient data transmission in a limited transmission frequency band. In relation to applications thereof, there has been used a demodulator to generate digital data in a circuit configuration in which a received signal is quadrature-demodulated to be thereafter converted into a digital signal.

Figure 2:
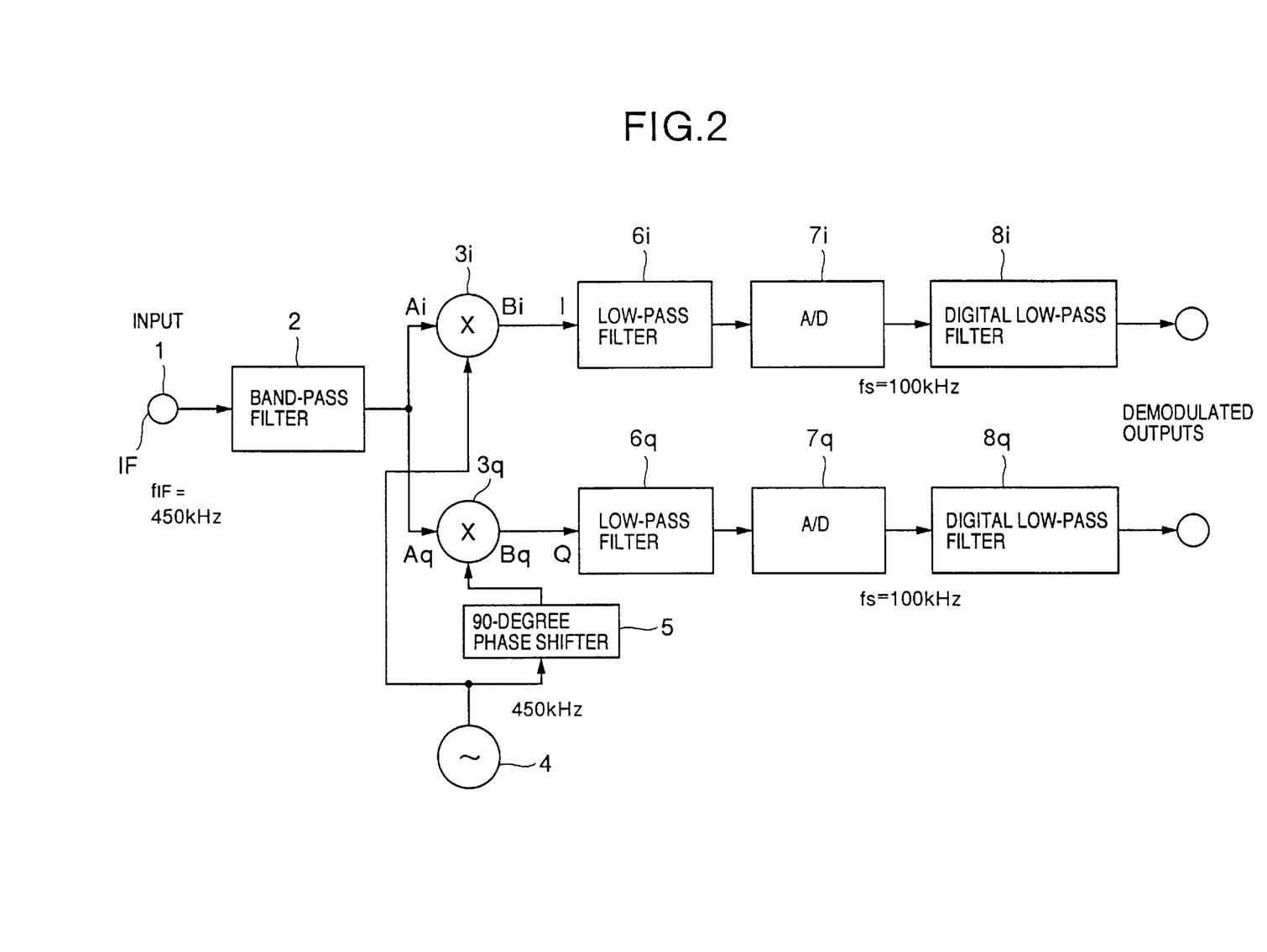
FIG. 2 is a block diagram showing an example of the digital demodulator of the quadrature amplitude modulation to produce digital data through analog signal processing.

An example of the demodulator in which an analog signal is directly demodulated such that the demodulated signal is converted into a digital signal has been described in pages 115 and 116 of "Signal Modulation and Demodulation for Digital Radio Communication" written by Yoichi Saito and published from the Institute of Electronics, Information and Communication Engineers (IEIC) on Aug. 20, 1996. Referring to FIG. 2, the demodulator circuit will be described.

In the demodulator shown in FIG. 2, a signal to be demodulated, i.e., a signal generated through a quadrature amplitude demodulation with a predetermined carrier frequency and a predetermined bandwidth is received by a front-end section of a receiver, not shown. The received radio frequency (RF) signal is converted into a signal of an intermediate carrier frequency $f_{IF}$ of, e.g., 450 kHz. The signal is then amplified by an intermediate-frequency amplifier section according to a predetermined gain to be supplied to an input terminal 1.

The received signal fed to the input terminal 1 is limited to a predetermined band through a band-pass filter 2 and then is inputted to multipliers 3i and 3q.

On the other hand, an oscillator 4 generates a signal having the frequency of the intermediate frequency (IF) signal, i.e., 450 kHz. The obtained signal is directly fed to the multiplier 3i and is supplied via a 90-degree phase shifter 5 to the multiplier 3q. These signals are each multiplied by the received signal to thereby conduct a quadrature demodulation to produce an in-phase (I) signal component and a quadrature-phase (Q) signal component.

Subsequently, the I and Q signal components synchronously demodulated by the multipliers 3i and 3q are respectively fed to low-pass filters 6i and 6q such that unnecessary harmonic components are removed therefrom. The signals passed through the filters 6i and 6q are then digitized respectively by analog-to-digital (A/D) converters 7i and 7q at a conversion rate (with a sampling frequency fs) of, e.g., 100 kHz to be converted into a digitized I signal and a digitized Q signal, respectively.

The I and Q signals in the digital form are inputted respectively to digital low-pass filters 8i and 8q such that a waveform shaping operation and a sampling frequency conversion are accomplished for the signals to resultantly obtain digital outputs, i.e., digital demodulated signals.

For the demodulator of the analog signal processing shown in FIG. 2, an initial adjustment is required after the demodulator is manufactured. Moreover, consideration has not been given to a phenomenon that characteristics of the demodulator inevitably change in relation to change in the operating conditions thereof, which leads to a problem of difficulty in the improvement of stability and precision.

That is, since the quadrature demodulation is accomplished through analog processing, there inevitably appear influences from, for example, constituent components of the analog circuit such as the precision with respect to phase of the 90-degree phase shifter, the frequency deviation or shift of the low-pass filter, and/or the phase amplitude error of the analog-to-digital (A/D) converter.

In consequence, there is required the initial adjustment for the characteristics above. Moreover, the characteristic are inevitably varied due to the change in temperature and power supply voltage as well as with lapse of time and hence the improvement of stability and precision is associated with difficulties.

In addition to the digital demodulator conducting the A/D conversion for the signal undergone the analog processing, there has been already known a digital demodulator of a circuit configuration in which the signal demodulation is carried out through digital signal processing.

An example of the demodulator to conduct the demodulation through digital signal processing has been described in page 171 of "Application of Digital Signal Processing" written by Nobuo Inoue and published from IEIC on Jul. 10, 1983.

According to the operation method of the digital signal processing circuit described above, the problem of the demodulation through the analog processing above can be avoided. However, in the method employing the digital signal circuit, there is required as a sampling frequency for the A/D conversion a frequency corresponding to the carrier frequency of the signal to be demodulated. As a result, this requires circuit elements operating at a high speed. Moreover, for the quadrature demodulator circuit and the digital low-pass filter, there are required complex signal generator circuits, multipliers, high-speed digital filter large-scale integrated circuits, which disadvantageously leads to increase in the circuit size.

Additionally, there can be considered a method in which the frequency of the signal to be demodulated is shifted to a base band before the digital demodulation. However, the circuit configuration becomes also complicated also in this case.

SUMMARY OF THE INVENTION

It is therefore an object of the present invention to provide a digital demodulator capable of achieving digital quadrature demodulation in which the signal processing system does not include any analog signal processing system considerably influencing the precision of the demodulation and the configuration thereof does not include such complex circuits as a quadrature local oscillator and a multiplier.

Another object of the present invention is to provide a digital demodulator including a digital low-pass filter as an essential component of the circuit configuration thereof in which the operation speed and the number of filter taps of the filter can be reduced.

According to the sampling theorem, it is possible to reproduce an original signal f limited with respect to the frequency spectrum as $|f| \leq fs/2$. Namely, there can be obtained a data sequence by sampling the original signal f with a period of 1/fs. The original signal f can be reproduced from the data sequence. The signal attained by sampling the original signal f with the period 1/f includes a repetitious component with a repeating spectrum in the band $|f| \leq fs/2$. The digital signal having the frequency spectrum is converted into an analog signal to be fed to a band-pass filter with a central frequency of fs so as to obtain signal components of $fs \pm fs/2$. The signal conversion processing is equivalent to a frequency shift of the original signal f to a signal of frequency fs. This principle is employed in the present invention.

In the digital demodulator of the present invention, assuming that the analog signal to be demodulated has a carrier frequency of $f_{IF}$ and the A/D converter has a sampling frequency of $f_S$, the following expression is held.

$$f_S = 4 \cdot f_{IF}/(2n+1) \qquad (1)$$

where, n is a positive integer. Accordingly, for a frequency $f_C$ of the quadrature local oscillation signal for the quadrature demodulation, the following relationship is satisfied.

$$f_C = f_S/4 \qquad (2)$$

Conducting an analog-to-digital (A/D) conversion for the analog signal having frequency $f_{IF}$ according to the sampling frequency $F_S$ of expression (1), the original analog signal is transformed into a digital signal having a carrier frequency of $f_C$ satisfying the following expression.

$$f_{C'} = |f_{IF} - A \cdot f_S| \qquad (3)$$
$$= |\{(2n+1)/4 - 4A/4\}f_S| = f_S/4$$

where, A=INT[(n+1)/2], INT[(n+1)/2] indicating an integer part of (n+1)/2. Accordingly, $f_{o'}$ is equal to $f_o$ according to equations (2) and (3).

On the other hand, in order to quadrature-demodulate the quadrature-modulated digital signal having carrier frequency $f_{c'}$, it is only necessary to multiply the modulated signal by a local oscillation signal having the same frequency, i.e., $f_C$ (=$f_S/4$). When a sine wave signal having frequency $f_C$ (=$f_S/4$) is sampled with frequency $f_S$, the signal is represented as 0, +1, 0, −1, 0, and so on. Resultantly, the generation of the local oscillation signal, 90-degree phase shift, and signal multiplication can be accomplished with a digital circuit having quite a simple configuration.

Furthermore, according to an embodiment of the present invention, the circuit configuration is determined to satisfy the following relationships for a symbol rate $f_{sym}$ of the modulated signal and the sampling frequency $f_{mS}$ of the digital filter as follows.

$$f_{sym} = m \cdot f_S/M \qquad (4)$$

where, M and m are positive integer and M>m, and $$f_{mS} = m \cdot f_S \qquad (5)$$

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Next, description will be given in detail of a digital demodulator according to the present invention by referring to the drawings.

Figure 1:
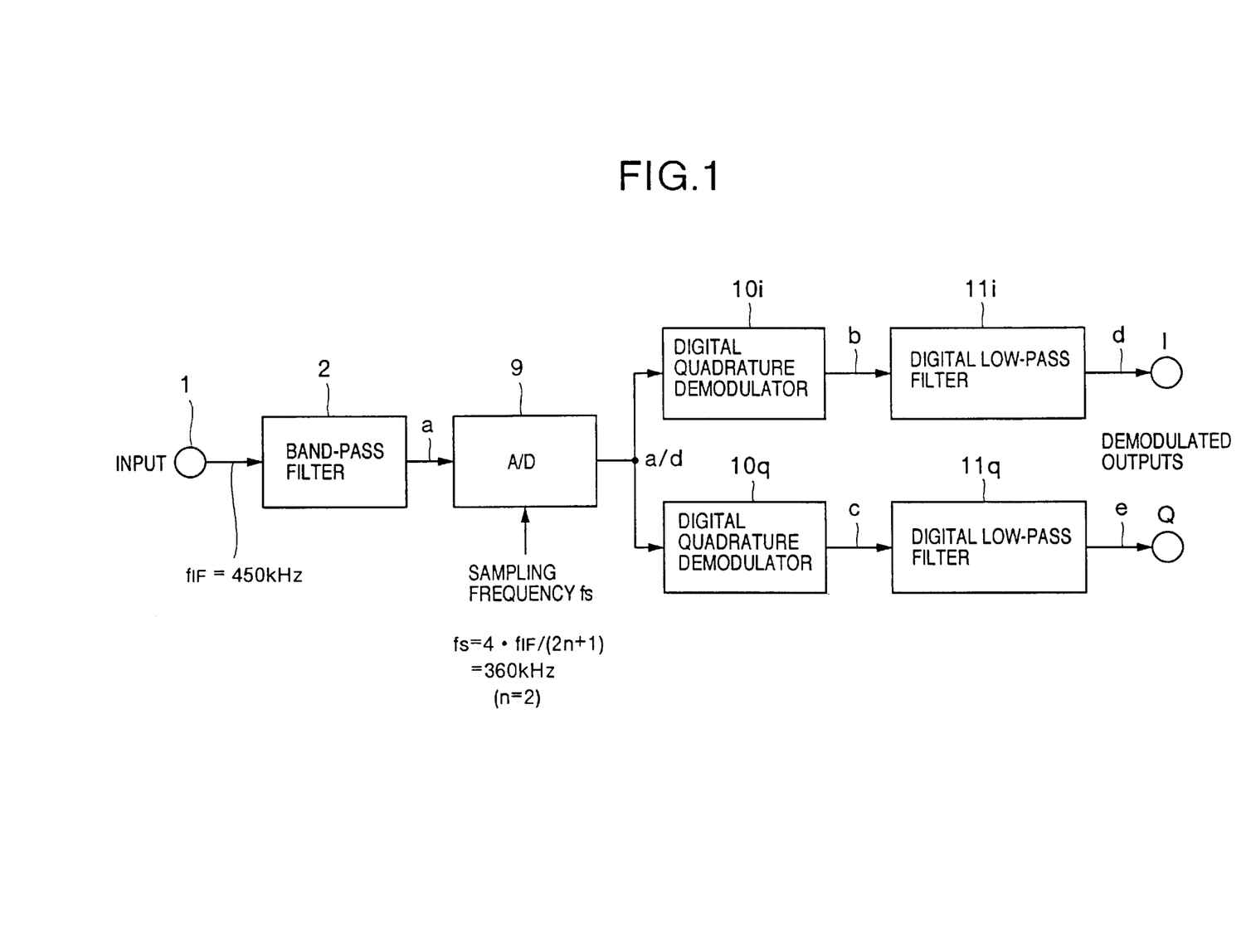
FIG. 1 is a block diagram showing an embodiment of a digital demodulator according to the present invention.

FIG. 1 shows the overall configuration of an embodiment of the digital demodulator according to the present invention. It is assumed that when an analog signal to be converted into a digital signal is received, the frequency of the signal is converted by a receiver circuit, not shown, into an intermediate frequency of $f_{IF}$ of an intermediate frequency band, for example, 450 kHz to be supplied to an input terminal 1.

The analog signal fed to the input terminal 1 is limited by a band-pass filter 2 to have a frequency of a predetermined frequency band. The analog signal a from the filter 2 is converted into a digital signal a/d by an A/D converter 9. The obtained digital signal a/d is inputted to digital quadrature demodulators 10i and 10q for a quadrature demodulation thereof so as to attain an I signal component and a Q signal component through the demodulation.

Next, the I and Q components are fed respectively to digital low-pass filters 11i and 11q to be subjected to a waveform shaping operation and a sampling frequency conversion so as to produce demodulated outputs, i.e., digital demodulated signals.

In the operation, a sampling frequency $f_S$ of the A/D converter 9 is selected to satisfy expression (1), namely, $f_S = 4 \cdot f_{IF}/(2n+1)$.

Assume that the integer n is two. Since $f_{IF}$ is 450 kHz, the sampling frequency $f_S$ is set to 360 kHz to convert the analog signal a into the digital signal a/d to obtain digitized data items $X_0$, $X_1$, $X_2$, $X_3$, and so on.

The digital data items $X_0$, $X_1$, $X_2$, $X_3$, and so on are inputted respectively to the digital quadrature demodulators 10i and 10q.

In this situation, the operating condition of the demodulators 10i and 10q are selected to satisfy the condition $f_C = f_S/4$ for the carrier frequency $f_C$ of the demodulators 10i and 10q.

Since the sampling frequency $f_S$ is 360 kHz, the carrier frequency $f_C$ is 90 kHz.

In this fashion, when a sine wave signal having a frequency $f_C = f_S/4 = 90$ kHz is sampled with frequency $f_S$ set to 360 kHz, the in-phase component sequentially and alternately changes with a period of t (=1/360 kHz) as +1, 0, −1, 0, +1 and so on. Similarly, the quadrature-phase component alternately changes with period t as 0, +1, 0, −1, 0, and so on.

Figure 4A:
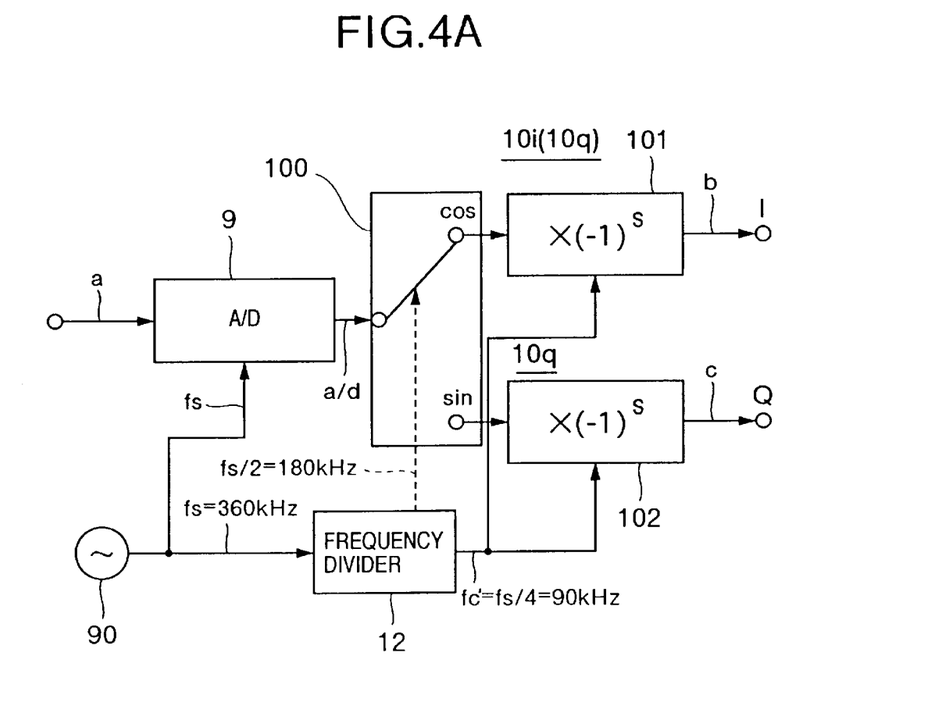
FIG. 4A is a block diagram showing an embodiment of a digital quadrature demodulator according to the present invention.

In this embodiment, as can be seen from FIG. 4A, there is employed for each of the digital quadrature demodulators 10$i$ and 10$q$ of FIG. 1 a frequency divider 12 which divides the output frequency $f_S$ (=360 kHz) from a sampling frequency signal generator 90 to produce a signal having a frequency of $f_S/2$ (=180 kHz) and a signal having a frequency of $f_S/4$ (=90 kHz), a change-over switch which conducts a change-over operation between a sine-wave signal side and a cosine-wave signal side with a period of $t_1$ (=1/180 kHz) at timing synchronized with the output frequency $f_S/2$ from the frequency divider 12, and polarity inverters 101 and 102 which acquire a value X of sampled data at a period of output frequency $f_S/4$ from the frequency divider 12 to achieve the polarity conversion.

First, the switch 100 is a switch circuit in which the signal passing route is changed over between two contact points at period $t_1$ (2/$f_S$=1/180 kHz). As shown in FIG. 4, the switch 100 distributes the signal outputted from the A/D converter 9 alternately to the cosine-wave signal side (in-phase component (I) side) and the sine-wave signal side (quadrature-phase component (Q) side). Resultantly, the output signal from the A/D converter 9 is divided into I component and Q component to be fed respectively to the sine-wave side and the cosine-wave side of the switch 100.

The distributed outputs are inputted to the polarity inverters 101 and 102, respectively.

Subsequently, each of the polarity inverters 101 and 102 is an arithmetic circuit which carries out an arithmetic operation of $(-1)^S$ for the received data according to the sample number S thereof such that the polarity of input data value is alternately inverted depending on whether the sample number S is odd or even. That is, the polarity-inverters 101 and 102 function as follows. When the sample number S is even (including zero), the data is multiplied by +1. When the sample number S is odd, the data is multiplied by $-1$.

In this operation, the sample number S of data is sequentially incremented by one for each sample on the sine-wave and cosine-wave sides. Consequently, the sample number S takes the value sequentially changing as 0, 1, 2, 3, 4, and so on.

As a result, the polarity inverter 101 produces data of $X_0$, 0, $-X_2$, 0, $X_4$, and so on; whereas, the polarity inverter 102 similarly produces data of 0, $X_1$, 0, $-X_3$, 0, and so on. Therefore, according to the embodiment, the quadrature-demodulated outputs of the I and Q components can be obtained in quite a simple circuit configuration including the switch circuit 100 and the arithmetic circuits 101 and 102 without using any analog circuit as shown in FIG. 4.

Next, description will be given of the demodulation above in comparison with operation of the demodulator circuit using the analog signal processing shown in FIG. 2.

Assume in the analog signal processing of FIG. 2 that multipliers 3$i$ and 3$q$ are respectively associated with inputs Ai and Aq and outputs Bi and Bq. In this case, the following relationships are derived.

$Bi = Ai \cdot \cos\omega t = Ai \cdot \cos 2\pi s f_C/f_S$ $Bq = Aq \cdot \sin\omega t = Aq \cdot \sin 2\pi s f_C/f_S$ where, $f_C$: Carrier frequency of Ai and Aq
  $f_S$: Sampling frequency (frequency of oscillator 4)
  $\omega$: $2\pi s f_C/f_S$
  s: No. of samples (0, 1, 2, 3, . . . )

Assuming $f_C = f_S/4$, the outputs Bi and Bq are obtained as follows.

for s=0
  $Bi = Ai \cdot \cos 2\pi \times 0 \times 90/360 = Ai$ $Bq = Aq \cdot \sin 2\pi \times 0 \times 90/360 = 0$ for s=1
  $Bi = Ai \cdot \cos 2\pi \times 1 \times 90/360 = 0$ $Bq = Aq \cdot \sin 2\pi \times 1 \times 90/360 = Aq$ for s=2
  $Bi = Ai \cdot \cos 2\pi \times 2 \times 90/360 = -Ai$ $Bq = Aq \cdot \sin 2\pi \times 2 \times 90/360 = 0$ for s=3
  $Bi = Ai \cdot \cos 2\pi \times 3 \times 90/360 = 0$ $Bq = Aq \cdot \sin 2\pi \times 3 \times 90/360 = -Aq$ Consequently, binarizing Ai and Aq representing the amplitude as Ai=Aq=1, the output Bi from the multiplier 3$i$ becomes 1, 0, $-1$, 0 and the output Bq from the multiplier 3$q$ becomes 0, 1, 0, $-1$.

Figure 3:
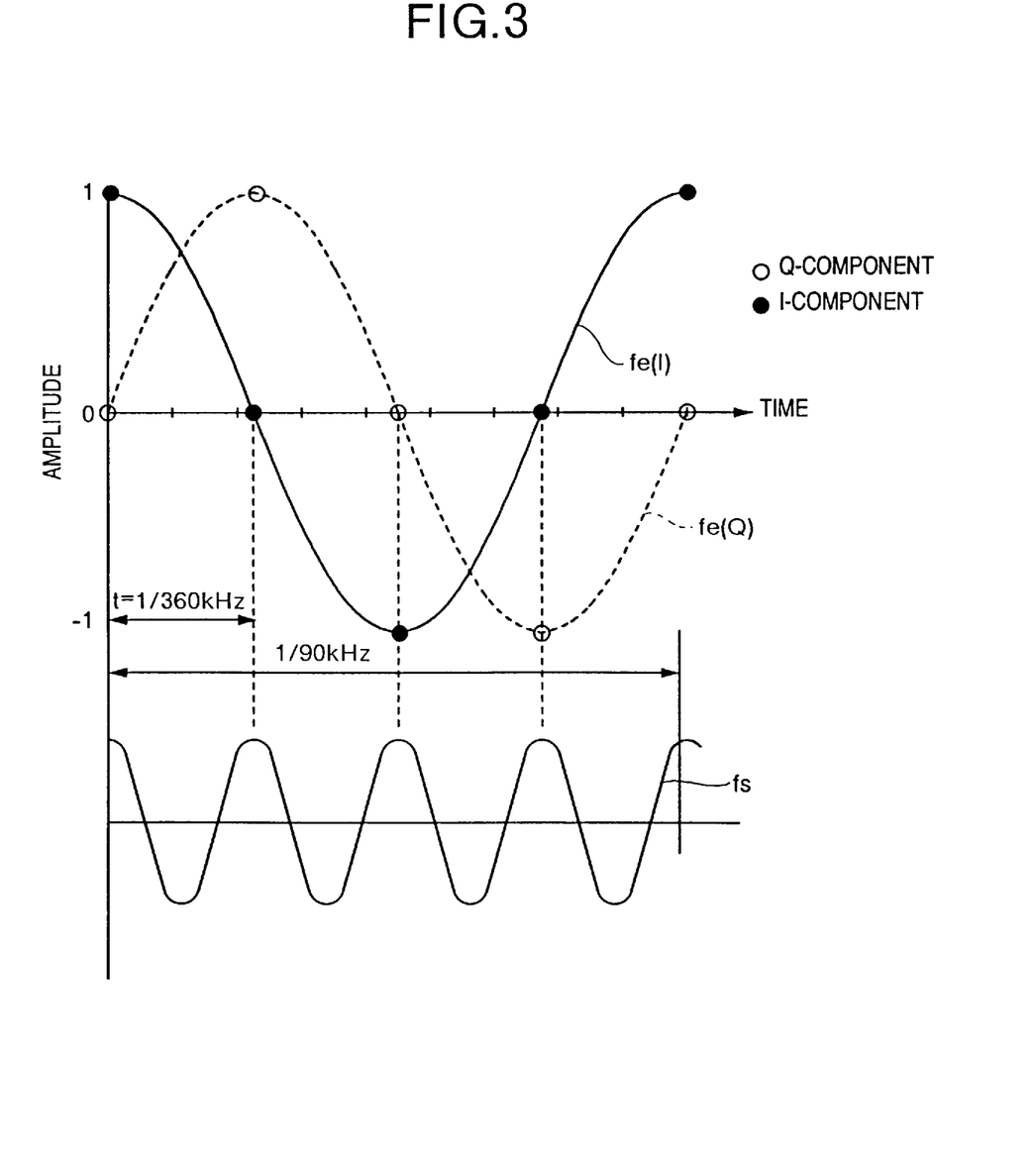
FIG. 3 is a waveform graph for explaining operation of the present invention.

This means that there are obtained the same results as those of the embodiment of the present invention described in conjunction with FIG. 3.

Referring now to the waveform graph of FIG. 4B, description will now be given again of operation of embodiment of the digital demodulator according to the present invention. Digital data sampled with the sampling frequency $f_S$ (FIG. 4B (b)) is divided into the cosine-wave and sine-wave components according to the frequency $f_S/2$ (FIG. 4B (c)). In the polarity inverters 101 and 102, the polarity of each data item of the cosine-wave and sine-wave components is then inverted in accordance with the frequency $f_C$ (=$f_S/4$) Resultantly, there are produced data items respectively of the in-phase (I) component (FIG. 4B (e)) and the rectangular-phase (Q) component (FIG. 4B (f)).

However, if the relationship $f_C = f_S/4$ is not held in the operation, the results above cannot be attained. Therefore, according to the embodiment of the present invention, the quadrature demodulation can be achieved with quite a simple circuit configuration as shown in FIG. 4A.

Figure 5:
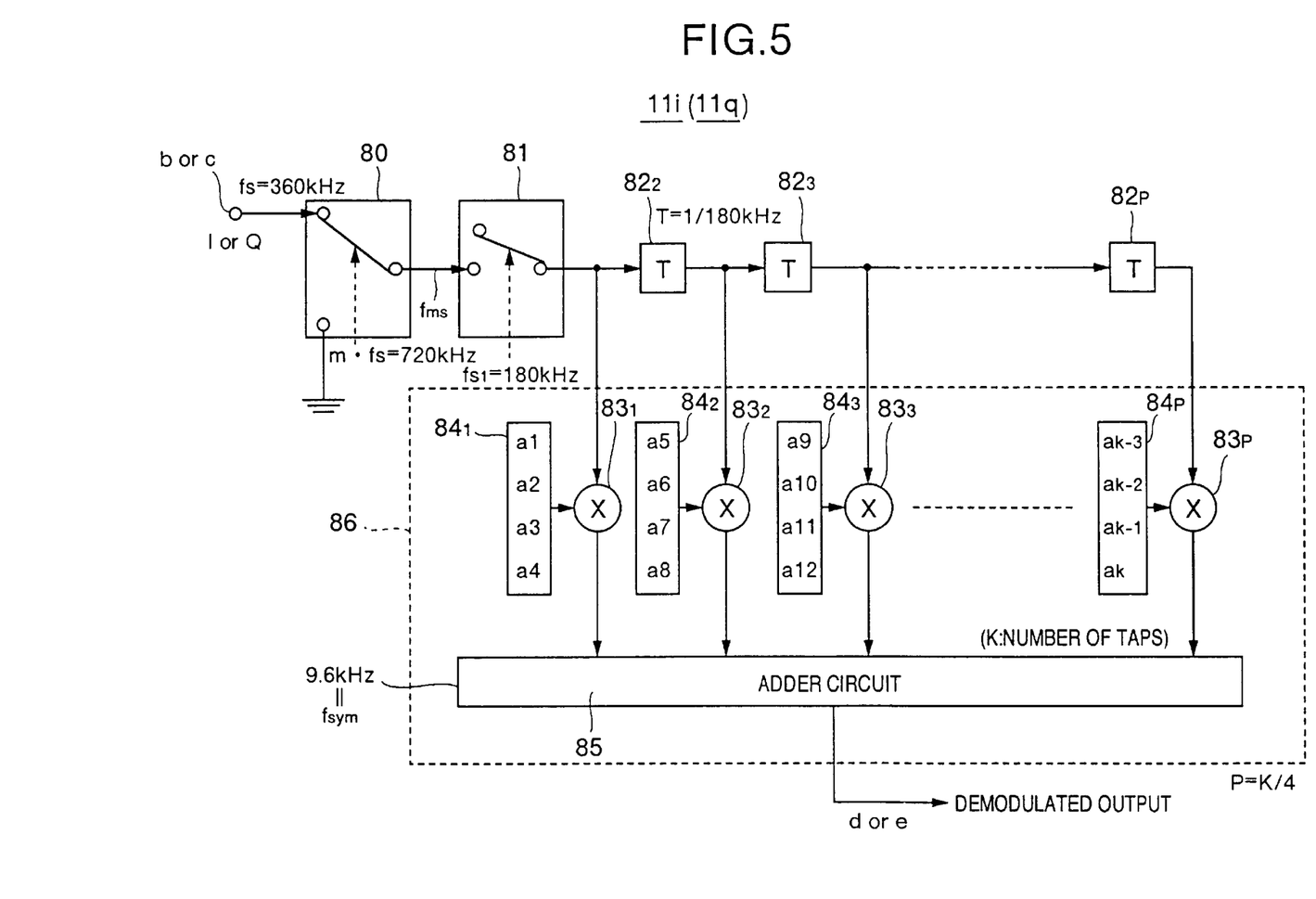
FIG. 5 is a block diagram showing an embodiment of a digital low-pass filter according to the present invention.

In the embodiment, the digital low-pass filters 11$i$ and 11$q$ may be substituted for a circuit shown in FIG. 5.

The configuration of FIG. 5 includes change-over switches 80 and 81, delay circuits $82_2$, $82_3$, . . . , $82_P$, multiplier circuits $83_1$, $83_2$, $83_3$, . . . , $83_P$, filter coefficient storage circuits $84_1$, $84_2$, $84_3$, . . . , $84_P$, and an adder circuit 85.

In the system, the delay circuits $82_2$ to $82_P$ configure a delay register and a portion 86 enclosed with broken lines is a filter coefficient product sum calculating section constituting a variable coefficient section.

In this embodiment, the values of M and m are respectively set as M=4 and m=2 to satisfy expression (4).

As shown in FIG. 5, the change-over switch 80 carries out the switching operation between its contacts at a period of 1/(m·$f_S$), namely, 1/720 kHz. Through the switching operation, the data inputted from the polarity inverter 101 or 102 and the data of the ground potential, i.e., data 0 are alternately acquired. The switch 80 produces an output in which "0" is sequentially inserted between the adjacent data items inputted thereto. Namely, the sampling frequency is virtually increased to 720 kHz to output data with the sampling frequency $f_{ms}$.

For example, for the in-phase component I and the quadrature-phase component Q, the switch 80 respectively produces data of $X_0$, 0, 0, 0, $-X_2$, 0, 0, 0, $X_4$ etc. and data of 0, 0, $X_1$, 0, 0, 0, $-X_3$, 0, 0, 0 etc.

In the embodiment, the change-over switch 80 is disposed to increase the data sampling frequency to 720 kHz (m·$f_S$) for the following reasons.

First, the coefficient product sum section 86 operates with a relatively low sampling frequency $f_{sym}$ set to 9.6 kHz, which will be described later. This enables the amount of processing in the section 86 to be reduced. Moreover, this value of sampling frequency is generally employed as a standard value.

Figure 4B:
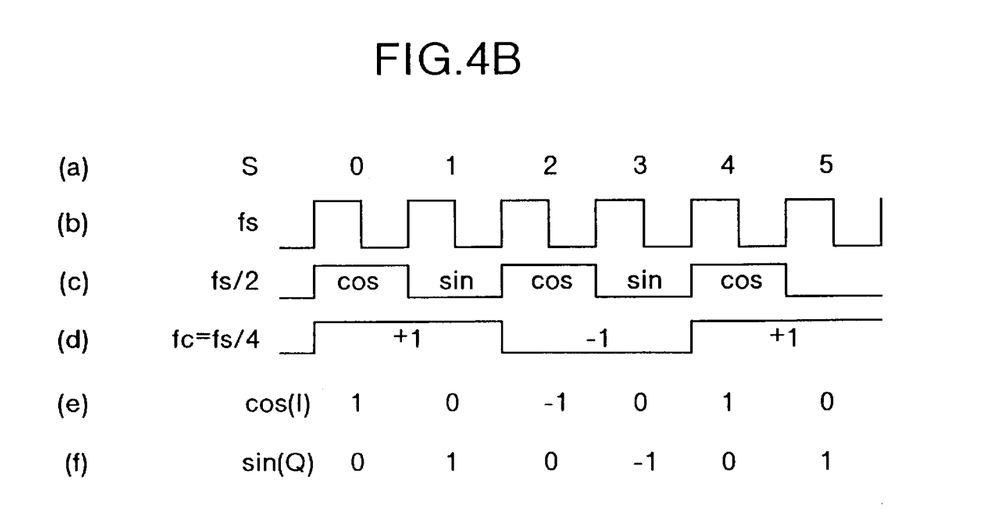
FIG. 4B is a signal diagram for explaining operation of the digital quadrature demodulator of FIG. 4A.

Next, for the data inputted from the polarity inverter 101 or 102, the sampling frequency is 360 kHz as described in relation to FIGS. 4A and 4B. In consequence, when it is desired to directly change the data into data associated with the sampling frequency of 9.6 kHz, the frequency division ratio is 360/9.6=37.5, which namely is other than an integer. In this situation, it is difficult to set an appropriate operation speed to the filter.

However, assume that the data sampled with 360 kHz is once sampled with a higher sampling frequency of 720 kHz to be thereafter converted according to a frequency division ratio of 720/9.6=75. In this case, if the system acquires every 75th data item from the resultant data items, there can be utilized a filter circuit of a low sampling frequency of 9.6 kHz.

Subsequently, the change-over switch 81 operates as shown in FIG. 5 with a sampling frequency $f_{S1}$ of 180 kHz ($=f_s \times 2/4$). The switch 81 acquires every fourth data item from the data items sequentially supplied from the output of the change-over switch 80. For the signal with the sampling frequency $f_{S1}$ (180 kHz), there can be used the signal produced from the frequency divider 12 of FIG. 4A. Moreover, the signal with the sampling frequency $f_{ms}$ (720 kHz) can be generated as follows. The signal with a frequency of 360 kHz from the sampling frequency signal generator 90 is multiplied by two by a frequency converter, not shown.

As above, due to the operation of the switch 80, every fourth data item is significant in the data items received by the switch 81 at a sampling period associated with 720 kHz. Through the function of the switch 81, there are produced data items with sampling frequency $f_{S1}$ including the in-phase (I) component as $X_1$, $-X_3$, etc. and the quadrature-phase (Q) component as $X_0$, $-X_2$, $X_4$, etc.

Next, the outputs from the switch 81 are fed sequentially through delay circuits $82_2$, $82_3$, ..., $82_P$ each for delay time T of 1/180 kHz. The output from each delay circuit and the output from the switch 81 are inputted in parallel to the coefficient product sum calculating section 86.

The product sum calculating section 86 includes multiplier circuits $83_1$, $83_2$, $83_3$, ..., $83_P$ and filter coefficient storage circuits $84_1$, $84_2$, $84_3$, ..., $84_P$ to conduct the calculation for every fourth symbols in association with the number of taps k. Namely, each symbol of data items which are related to the sampling frequency $f_{S1}$ (=180 kHz) and which are inputted to the calculating section 86 in a parallel fashion is multiplied by associated filter coefficients $a_1$, ..., $a_k$ obtained from the related one of the storage circuits $84_1$ to $84_P$ for the pertinent symbol. The products thus created for the respective symbols are added to each other by the adder section 85 to produce the demodulated signal.

Consequently, for the delay circuits 82, multiplier circuits 83, and coefficient storage circuits 84, the suffix p is set as p=k/4. Namely, the number of delay circuits 82 is represented as (p-1). The number of the multipliers 83 is equal to that of the storage circuits 84, namely, p.

In the configuration, the number of taps k is determined by steepness or abruptness of the cutoff frequency of the filter, namely, roll-off rate.

At present, there are used about 20 to about 100 taps, which however does not restrict the present invention.

In operation, for the first symbol of the input data, filter coefficients $a_1$, $a_5$, $a_9$, ..., $a_{k-3}$ are obtained from the respective coefficient storages $84_1$ to $84_P$ to be multiplied by data of the symbol by the multipliers $83_1$ to $83_P$, respectively. For the next symbol, filter coefficients $a_2$, $a_6$, $a_{10}$, ..., $a_{k-2}$ are multiplied by data of the symbol. This processing is sequentially and repetitiously accomplished for every fourth symbol. The resultant products are added to each other by the adder 85 to produce a demodulated signal with sampling frequency $f_{sym}$=9.6 kHz.

Therefore, according to the embodiment, there can be easily provided a digital demodulator for quadrature amplitude modulation signals including only digital signal processing circuits as can be seen from FIGS. 1, 4A, 4B, and 5. The digital demodulator includes the digital low-pass filters 8i and 8q including low-speed circuit components operating at a frequency lower than the carrier frequency (450 kHz) of the signal to be demodulated.

Furthermore, in accordance with the embodiment, since the sampling frequency $f_s$ in the digital quadrature demodulation and the sampling frequency $f_{ms}$ are set to hold $f_{ms}=m \cdot f_s$, the operation speed of the digital band-pass filter and the number of filter taps can be remarkably decreased. Resultantly, the circuit size of the digital demodulator can be sufficiently minimized.

Subsequently, description will be given of another embodiment of the present invention.

As can be understood from the explanation above, in the digital low-pass filters 11i and 11q shown in FIG. 5, the same filter coefficients $a_l$ to $a_k$ are adopted respectively for the I and Q signal components.

Consequently, when the sampling frequency $f_{S1}$ (=180 kHz) and the number of stages of delay registers are respectively doubled to utilize the filter in a time-sharing manner so as to share functions of the primary section of the filter, the I and Q demodulated outputs can be attained by one filter circuit.

Figure 6:
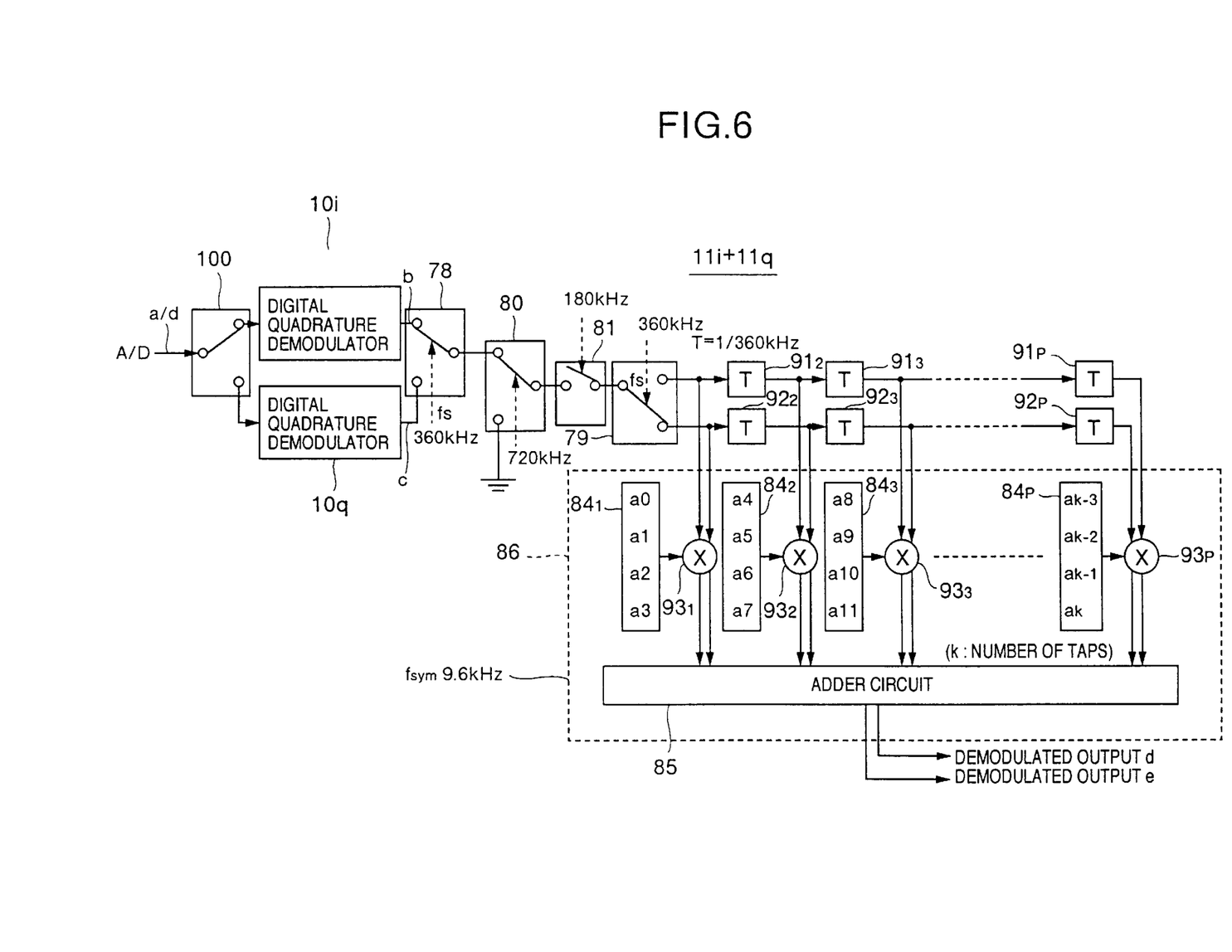
FIG. 6 is a block diagram showing another embodiment of a digital low-pass filter according to the present invention.

FIG. 6 shows an embodiment achieving the operation above. The configuration of FIG. 6 includes change-over switches 78 and 79 operating with a sampling frequency $f_s$ of 360 kHz, delay sections $91_2$, $91_3$, ..., $91_P$ and $92_2$, $92_3$, ..., $92_P$ each having delay time T of 1/360 sec., and multipliers $93_1$, $93_2$, $93_3$, ..., $93_P$. The other constituent components are the same as those of the embodiment shown in FIGS. 1 and 5.

Next, description will be given of operation of the embodiment shown in FIG. 6. The signal outputted from the A/D converter is alternately distributed by a change-over switch 100 to digital quadrature demodulators 10i and 10q at an interval of 1/360 sec.

Through operation of a switch 78, signals b and c respectively from the demodulators 10i and 10q are alternately outputted at an interval of 1/360 sec.

The outputted signals are sampled with a frequency $f_s$=720 kHz by a switch 80. Unnecessary data is removed by a switch 81 to produce a data signal having a frequency $f_s$=180 kHz. The data signal is then filtered by a change-over switch 79 with a frequency of 360 kHz.

In consequence, according to the embodiment, there is provided a digital demodulator including only one digital low-pass filter.

In this connection, the filter coefficients are alternately used for the I and Q signal components in the digital low-pass filters 11i and 11q of FIG. 6 according to the present invention.

By alternately varying the sign of the filter coefficients in the situation, the results of processing achieved by the polarity inverters 101 and 102 described in conjunction with FIGS. 4A and 4B, namely, the results of $(-1)^S$ according to the data sample number S can be obtained. Resultantly, the function of the change-over switch 90 as well as the function of quadrature demodulation can be incorporated in the digital low-pass filter itself. This advantageously makes it possible to remove the quadrature demodulator circuits from the system.

Figure 7:
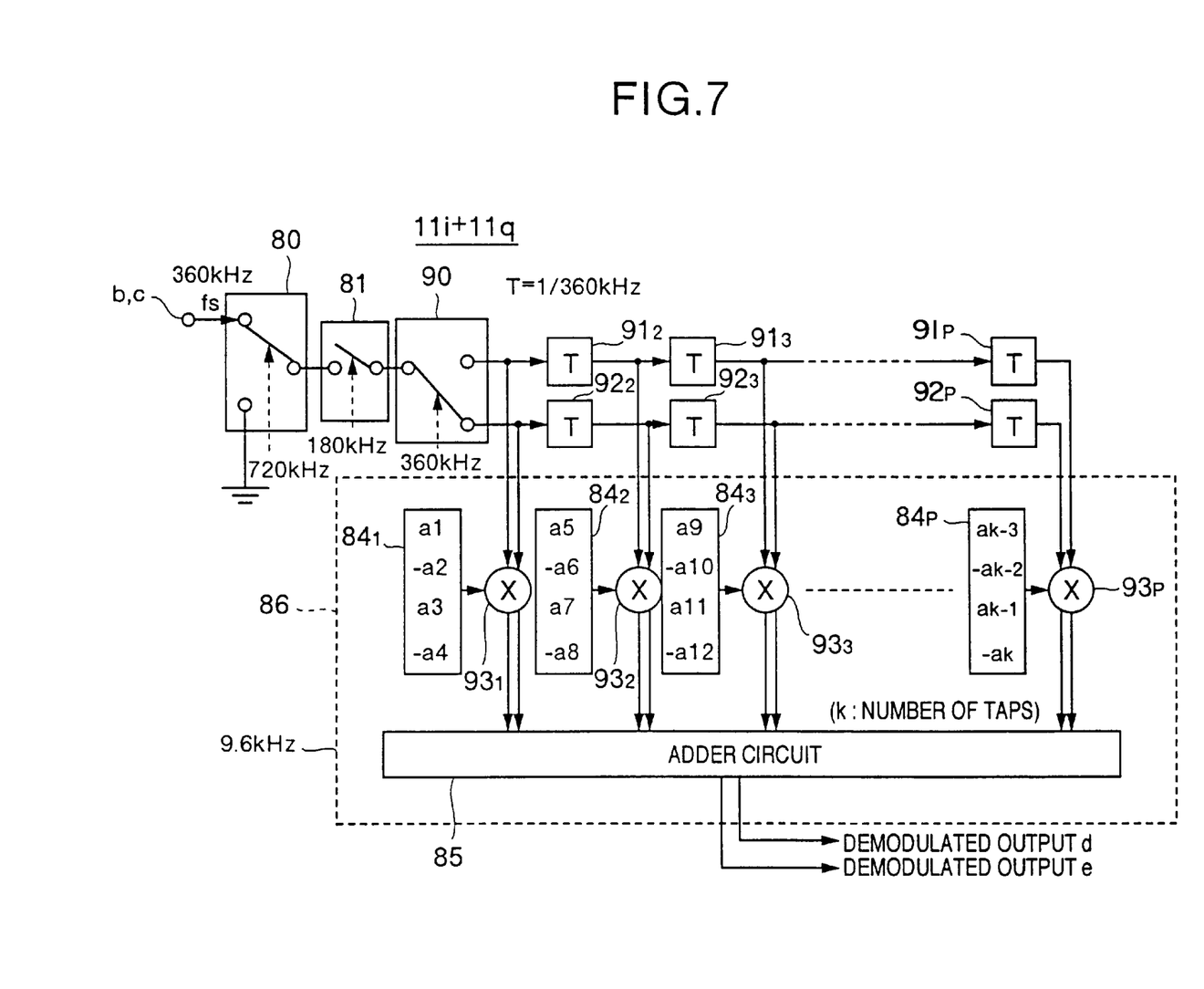
FIG. 7 is a block diagram showing still another embodiment of a digital low-pass filter according to the present invention.

FIG. 7 shows an embodiment of a digital low-pass filter conducting the functions of the filters 11$i$ and 11$q$ in which the function of quadrature demodulation is incorporated. This embodiment varies from that of FIG. 6 in that the sign of filter coefficients stored in the filter coefficient storages $84_1$, $84_2$, $84_3$, . . . , $84_P$ is alternately changed as plus and minus.

The change-over switch 90 operates with a sampling frequency $f_S$ of 360 kHz and hence carries out the function of the change-over switch 100 of FIG. 4 to separate the I and Q signal components from each other so as to supply one of these signal components to the delay circuits $91_2$, $91_3$, . . . , $91_P$ and the remaining one thereof to the delay circuits $92_2$, $92_3$, . . . , $92_P$.

On receiving data items from the delay circuits $91_2$, $91_3$, . . . , $91_P$, the multiplier circuits $93_1$, $93_2$, $93_3$, . . . , $93_P$ select the filter coefficients with a plus sign from those stored in the storage circuits $84_1$, $84_2$, $84_3$, . . . , $84_P$ for the multiplication. On the other hand, for the data items received from the delay circuits $92_2$, $92_3$, . . . , $92_P$, the multiplier circuits $93_1$, $93_2$, $93_3$, . . . , $93_P$ select the filter coefficients with a minus sign from those stored in the storage circuits $84_1$, $84_2$, $84_3$, . . . , $84_P$ for the multiplication. With this provision, there can be accomplished an operation substantially equal to the processing achieved by the polarity inverters 101 and 102 shown in FIG. 4.

Therefore, in accordance with the embodiment of FIG. 7, the demodulated outputs of the I and Q signals can be alternately obtained from the adder circuit 85 operating with the sampling frequency $f_{sym}$=9.6 kHz. As a result, there can be constructed a digital modulator having a simpler configuration.

Figure 8:
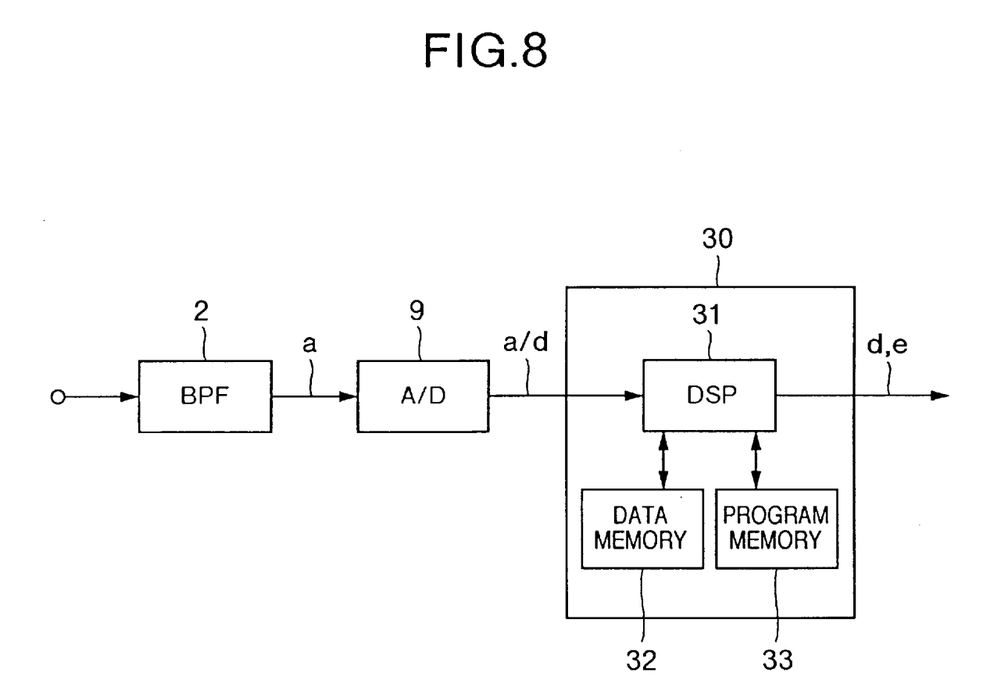
FIG. 8 is a logic diagram for implementing the digital demodulator by software using a digital signal processor (DSP) according to the present invention.

In the embodiments described above, the signal processing after the analog-to-digital conversion is carried out for data in the digital-signal form. Therefore, in the digital demodulator of the present invention, a portion of or all of the signal processing functions of the digital quadrature demodulators 10$i$ and 10$q$ and the digital low-pass filters 11$i$ and 11$q$ can be implemented by hardware digital circuits. On the other hand, using a computer, these functions may be achieved by software including signal processing programs. Referring to FIG. 8, an embodiment of the software processing will be next described.

The configuration of FIG. 8 includes a band-pass filter 2, an analog-to-digital (A/D) converter 9, and a digital signal processing section 30. The section 30 includes a microprocessor or a digital signal processor (DSP) 31, a memory 32 to store processing data therein, and a memory 33 to store processing programs therein. The processing programs stored in the memory 33 are described in the format of program codes for the processing procedures equivalent to multiplication, addition, delaying and switching operations, and the like of digital signals in the signal processing conducted by the circuits shown in FIGS. 1, 4A, 4B, and 5–7. The DSP 31 processes digital signals produced from the A/D converter 9 according to a processing procedure read from the program memory 33. In this regard, coefficient data and the like necessary for the filtering operation are beforehand stored in the data memory such that the data is read therefrom when necessary. Furthermore, the delay operation of the filter can be implemented by controlling the data read and write operations of the data memory 32. For the program memory 33 and the data memory 32, there can be used any types of storage media such as a semi-conductor memory, a magnetic disk memory, and an optical disk memory from which the computer and the DSP can read data.

According to the present invention, the digital demodulator can be configured without using any high-speed analog-to-digital converter. Additionally, the generation of and 90-degree shift of the carrier signal necessary for the digital quadrature demodulation as will as the circuit functions required for the production of sum of products can be materialized with digital circuits in quite a simple configuration. Resultantly, it is possible to satisfactorily reduce the hardware system size of the digital demodulator.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

We claim:

1. A digital demodulator comprising:
   a converter for converting an analog input signal into a digital signal, said converter operating so as to satisfy $f_s = 4 \cdot f_{IF}/(2n+1)$, wherein $f_{IF}$ indicates an intermediate carrier frequency, $f_s$ is a sampling frequency and n indicates a positive integer;
   a signal processing section for quadrature demodulating said digital signal output from said converter by mixing with quadrature local oscillation signals, a frequency $f_{c'}$, of said quadrature local oscillation signal is $f_{c'} = f_s/4$, wherein said signal processing section extracts a first and a second digital signal being orthogonal in phase to each other, and said first and second digital signals being alternately inverted in polarities with said sampling frequency;
   at least one digital filter section coupled with said signal processing section for sampling said first and second digital signals, said digital filter section comprising:
   first switching means, and
   second switching means,
   said first switching means conducting a change-over operation between said digital signals and a signal at binary zero with a frequency m·$f_s$, and said second switching means receiving the signals from said first switching means and intermittently outputting therefrom signals at a period corresponding to a frequency m·$f_s$/M, wherein m and M are positive integers and M>m; and
   at least one filter arithmetic section coupled with said digital filter section, for producing demodulated signals.

2. A digital demodulator according to claim 1, wherein two said digital filter sections are coupled with said signal processing section, said first and second digital signals being supplied to said respective digital filter sections, the outputs of which are supplied to said respective filter arithmetic sections.

3. A digital demodulator according to claim 1, further including:

a third switch means for conducting a change-over operation between said first and second digital signals with said sampling frequency $f_s$ and inputting signals therefrom to said first switching means, wherein said digital filter section includes a fourth switching means for conducting a change-over operation for signals from said second switching means and outputting signals to said filter arithmetic section.

* * * * *